US006825548B2

United States Patent
Fujioka et al.

(10) Patent No.: US 6,825,548 B2
(45) Date of Patent: Nov. 30, 2004

(54) SEMICONDUCTOR DEVICE

(75) Inventors: Toru Fujioka, Kokubunji (JP); Isao Yoshida, Hinode (JP); Toshihiko Shimizu, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/455,458

(22) Filed: Jun. 6, 2003

(65) Prior Publication Data

US 2004/0000676 A1 Jan. 1, 2004

(30) Foreign Application Priority Data

Jun. 28, 2002 (JP) ......................................... 2002-190060

(51) Int. Cl.$^7$ ............................................ H01L 23/495
(52) U.S. Cl. ........................ 257/666; 257/676; 257/735; 257/784
(58) Field of Search ................................. 257/666, 676, 257/735, 784, 690, 691, 692, 693, 674, 773

(56) References Cited

U.S. PATENT DOCUMENTS 5,648,681 A * 7/1997 Takashima et al. ......... 257/666
2002/0025606 A1 * 2/2002 Kurihara et al. ............ 438/122

FOREIGN PATENT DOCUMENTS

JP         8-172306        7/1996

OTHER PUBLICATIONS

IEICE, "Basics of GaAs Field Effect Transistors", 1992, pp. 195–198.

Procedure of 1999 RAWCON, "Highly Efficient 2.2–GHz Si Power MOSFETs for Cellular Base Station Applications", Aug., 1999 M. Morikawa et al, pp. 305–307.

Procedure of 2001 International Symposium on Power Semiconductor Devices and ICs Osaka, "A High Efficiency High Power GAAs Push–Pull FET for W–CDMA Base Stations", K. Inoue et al.

* cited by examiner

Primary Examiner—Long Pham
Assistant Examiner—DiLinh Nguyen
(74) Attorney, Agent, or Firm—Mattingly, Stanger & Malur, P.C.

(57) ABSTRACT

It is to be made possible to eliminate unevenness of the inductances of bonding wires and to reduce the size of semiconductor devices. Over the surface of a semiconductor device in whose MISFET formation area a MISFET comprising a plurality of unit MISFETs connected in parallel, gate electrode pads electrically connected to the gate electrode of the MISFET and drain electrode pads electrically connected to the drain electrode of the same are arranged in a row each. The intervals of the gate electrode pads become gradually shorter from the end areas towards the central area of the electrode array of the gate electrode pads. The intervals of the drain electrode pads also become gradually shorter from the end areas towards the central area of the electrode array of the drain electrode pads.

10 Claims, 13 Drawing Sheets

1: SEMICONDUCTOR DEVICE
2: MISFET FORMATION AREA
3: GATE ELECTRODE PAD
3a: ELECTRODE ARRAY
4: DRAIN ELECTRODE PAD
4a: ELECTRODE ARRAY

1: SEMICONDUCTOR DEVICE
2: MISFET FORMATION AREA
3: GATE ELECTRODE PAD
3a: ELECTRODE ARRAY
4: DRAIN ELECTRODE PAD
4a: ELECTRODE ARRAY

SEMICONDUCTOR DEVICE

BACKGROUND OF THE INVENTION

The present invention relates to a semiconductor device and more particularly to a technique that can be effectively applied to a high frequency semiconductor amplifying device for use at a high frequency of about 400 MHz or above.

Semiconductor amplifying devices for microwave use have become even higher in applicable frequency and in output over the recent years, and are extensively used in microwave communication equipment as key devices. Especially, metal oxide semiconductor field effect transistors (MOSFETs) are extensively used to meet high frequency and high output requirements, and are keenly demanded to achieve even higher outputs and higher efficiencies. For this reason, high frequency and high output transistors for use in communication equipment need to be greater in element size (gate width) to increase the output power.

However, MOSFETs used in power amplifiers tend to drop in gain and efficiency as their total gate widths are expanded to increase the power outputs. This phenomenon is discussed in, for instance, The Institute of Electronics, Information and Communication Engineers, *Basics of GaAs Field Effect Transistors* (in Japanese), 1992, pp. 195–198.

To solve this problem, there is used a method by which multiple small size MOSFETs are connected in parallel to distribute and synthesize signals and thereby expand the total gate width equivalently. One such circuit is described, for instance, in the Japanese Unexamined Patent Publication No. Hei 8(1994)-172306 (hereinafter referred to as First Art). In the power amplifying circuit disclosed therein, two MOSFETs are connected in parallel, of each of which the gate electrode is connected to an input side distributing circuit and the drain electrode is connected to an output side synthesizing circuit, both by bonding wires.

Among MOSFET devices for base station use, which require large gate widths to achieve an output of hundreds of watts (W), what have come to constitute a mainstream are internally matching circuit type MOSFET devices, each having in the package a circuit for matching the impedance with an external circuit in addition to a MOSFET chip having a large total gate width to achieve a high output without sacrificing high frequency characteristics. Such internally matching circuit type MOSFET devices are discussed, for instance, in Morikawa et al., "High Efficient 2.2-GHz Si Power MOSFETs for Cellular Base Station Applications", Proc. of 1999 *RAWCON*, p. 305–307, August 1999 and K. Inoue et al., "A High Efficiency High Power GaAs Push-Pull FET for W-CDMA Base Stations", Proc. of 2001 *International Symposium on Power Semiconductor Devices & ICs*, Osaka (hereinafter referred to as Second Art). In each of the internally matching circuit type MOSFET devices disclosed therein, a MOSFET chip is provided on a package, and pads for input and output electrodes of the MOSFET chip are connected to an internally matching circuit configured on the package.

While both First and Second Arts cited above use a configuration in which an external circuit is connected to a MOSFET, a method by which the whole of a MOSFET having a large gate width is caused to operate uniformly to prevent its high frequency characteristics from deterioration is disclosed in the Japanese Unexamined Patent Publication No. Hei 11(1999)-238851 (hereinafter referred to as Third Art). According to the technique disclosed therein, the input electrode pads of the MOSFET and the input terminal of the external circuit are connected in parallel to each other by a plurality of bonding wires, and so are the output electrode pads of the MOSFET and the output terminal of the external circuit. The length of the bonding wire is minimized at the center of the wiring array and consistently increased toward each end of the wiring array.

SUMMARY OF THE INVENTION

According to First Art cited above, the problem that the gain and efficiency drop with an increase in the gate width of the MOSFET is addressed by amplifying signals by using bisected MOSFETs, each of a relatively small gate width. This configuration serves to reduce losses suffered in changing the impedance and to prevent the high frequency characteristics of the MOSFETs from deteriorating, and thereby to reduce the deterioration of the high frequency characteristics of the power amplifying circuit. However, according to this First Art, distributing circuits on both the input side and the output side should be large relative to the size of the two divided MOSFETs. As a result, the possibility of reducing the device size is restricted, and it is also difficult to reduce the number of components used. Furthermore, although small divided MOSFETs are used, the whole MOSFETs are not uniformly operating in the high frequency band, making it impossible to enable the MOSFETs to fully realize their performance potential.

The configuration according to Second Art cited above allows matching to be achieved in a wide band with little loss even where the gate width is large and the impedance of the MOSFET is very low, and is effective for changing the impedance with a reduced deterioration of high frequency characteristics. However, this Second Art takes no account of the impedance change in each of the unit MOSFETs constituting the MOSFET device. As a result, as according to First Art discussed above, the whole MOSFET device is not uniformly operating in the high frequency band, making it impossible to enable the MOSFETs to fully realize their performance potential. Moreover, as it requires a circuit for carrying out impedance matching with the external circuit, the possibility of reducing the device size is restricted, and it is also difficult to reduce the number of components used.

Thus, First and Second Arts are not intended to enable the unit MOSFETs constituting the MOSFET device to operate uniformly at a high frequency. Moreover they require a special external circuit, and any attempt to enhance the performance would invite an increased circuit size. Therefore, it is difficult to reduce the size and enhance the performance at the same time, resulting in a failure to enable the MOSFETs to fully realize their performance potential.

Unlike First and Second Arts described above, Third Art is intended to uniformize power transmission over bonding wires by adjusting the lengths of the bonding wires, and thereby to improve the gain of the microwave amplifier, power adding efficiency and distortion characteristics. As compared with First and Second Arts, it has an advantage in size reduction since no special external circuit is added to the microwave amplifier in which the input and output electrodes of the MOSFETs are connected by a plurality each of wires. However, according to this Third Art, the performance potential of MOSFETs is actualized by contriving effective wiring for the connection of the MOSFETs and the external circuit. Where bonding wires are applied for wiring, for instance, they require length adjustment, which complicates the subsequent steps of the manufacturing process. Particularly in a MOSFET device for base station use, which requires an output of hundreds of watts and therefore an extremely large gate width, a voltage drop due to the parasitic resistance of the bonding wires should be prevented and the matching circuit design should be adapted to a drop in the impedance of the device. This requires a vast number of bonding wires, resulting in an increased influence of mutual inductance. For this reason, Third Art which involves adjustment of the lengths of the bonding wires requires a large difference between long and short bonding wires. However, in usual packaging, the minimum spacing (interval) between a MOSFET chip and an element which are connected by bonding wires, and adjustment of the relative lengths of bonding wires requires long bonding wires. This necessitates a large packaging area and therefore invites an increased device size. Even if the semiconductor chip is reduced in size, the area needed for packaging that semiconductor is enlarged, making it difficult to reduce the size of the whole device.

An object of the present invention is to provide a semiconductor device improved in high frequency characteristics.

Another object of the invention is to provide a semiconductor device capable of uniform operation.

Another object of the invention is to provide a semiconductor device permitting a reduction in size.

Another object of the invention is to provide a semiconductor device permitting a reduction in packaging area.

The aforementioned other objects and novel features of the invention will become more apparent from the description in this specification and the accompanying drawings.

Typical aspects of the invention disclosed in this application will be briefly described below.

In a semiconductor device according to the invention, a semiconductor amplifying element is formed, and on its surface, electrodes for inputting and electrodes for outputting electrically connected to the semiconductor amplifying element are formed, and the intervals of electrodes are shorter in the central area than in the end areas of an electrode array comprising input electrodes or an electrode array comprising output electrodes.

In a semiconductor device according to the invention, input electrodes of a semiconductor chip in which a semiconductor amplifying element is formed and an input terminal outside the semiconductor chip or output electrodes and an output terminal outside the semiconductor chip may be connected in parallel by a plurality of wiring lines, and wiring intervals may be shorter in the central area than in the end areas, of a wiring array comprising the plurality of wiring lines.

In a semiconductor device according to the invention, a plurality of semiconductor amplifying elements connected in parallel may be formed, and the ground electrodes of semiconductor amplifying elements in the central area, out of the plurality of semiconductor amplifying elements, may be shorter than the ground electrodes of semiconductor amplifying elements in the end areas, out of the plurality of semiconductor amplifying elements.

In a semiconductor device according to the invention, a plurality of semiconductor amplifying elements connected in parallel may be formed, and the widths of the ground electrodes, or of the doped layer formed over the semiconductor substrate connected to the ground electrodes of semiconductor amplifying elements in the central area, out of the plurality of semiconductor amplifying elements, may be greater than the ground electrodes, or the width of the doped layer formed over the semiconductor substrate connected to the ground electrodes, of semiconductor amplifying elements in the end areas, out of the plurality of semiconductor amplifying elements.

DETAILED DESCRIPTION OF THE PREFERRED EMBODIMENTS

The preferred embodiments of the present invention will be divided into a plurality of sections in the description if convenience so requires, but the sections are by no means unrelated to one another unless expressly stated otherwise, but one is a modification or details of, or supplementary or otherwise related to, part or the whole of another. When the number (which may be the numerical value, quantity, range or any other quantitative expression) of any elements is mentioned, it is not meant to limit the elements to that number, which instead may be more or less than that unless expressly limited or logically no other number is possible. Furthermore, all of the constituent elements (including elemental steps) of the following preferred embodiments are obviously not absolutely indispensable unless expressly stated otherwise or logically considered indispensable. Similarly, any reference in the description of the preferred embodiments to the shape, positional relationship or any other attribute of any constituent element includes what substantially approximates or is similar to that shape or the like unless expressly stated otherwise or exactness is logically required. This is true of the numerical value and the range mentioned above.

The preferred embodiments of the invention will be described in detail below with reference to the accompanying drawings. In all the drawings for describing the embodiments of the invention, constituent members having the same functions are denoted by respectively the same reference signs, and their description will not be repeated.

(Embodiment 1)

Figure 1:
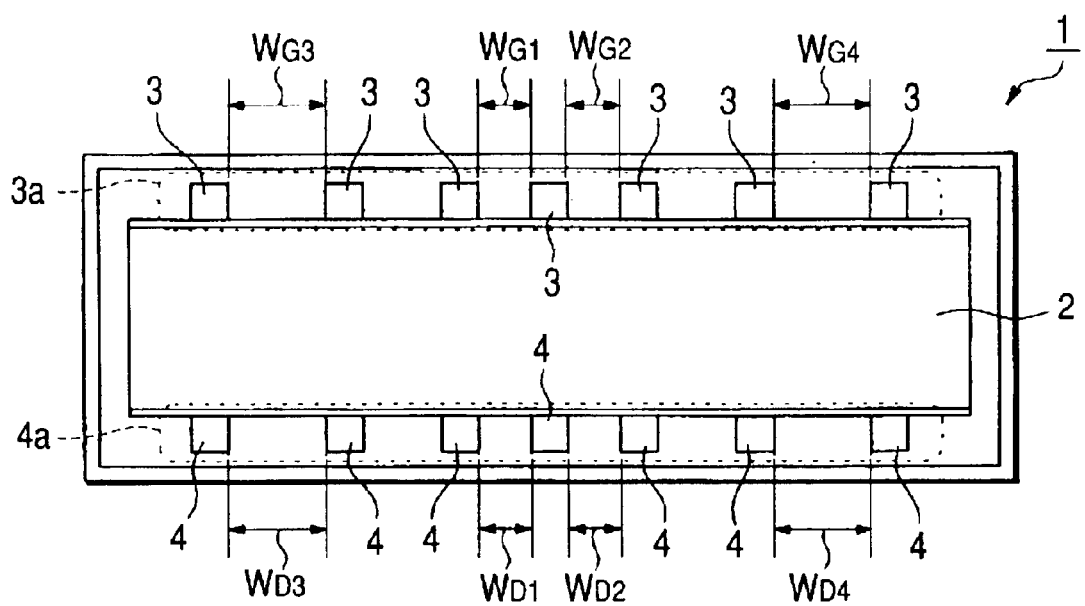
FIG. 1 is a plan showing an overall view of a semiconductor device, which is a preferred embodiment of the present invention, from above.

A semiconductor device in this mode of implementing the invention will be described with reference to drawings. FIG. 1 is a plan showing an overall view of this semiconductor device from above.

The semiconductor device (semiconductor chip) 1 in this mode of implementation shown in FIG. 1 is a high frequency power amplifying element chip or a semiconductor amplifying device for use at, for example, a high frequency of approximately 400 MHz or above (a region or frequency band of or above the microwave), and on its surface layer or its inside are formed semiconductor amplifying elements (semiconductor elements), such as metal insulator semiconductor field effect transistors (MISFETs). On one of the two side edges of a MISFET formation area (semiconductor element formation area or semiconductor amplifying element formation area) 2, the area in which the semiconductor amplifying elements, or the MISFETs in this case, are formed, there are formed gate electrode pads 3 as input surface electrodes (electrodes for wire connection) or input electrode pads. The gate electrode pads 3 are arranged in a row to constitute an electrode array (pad array) 3a. On the other side edge of the MISFET formation area 2 are formed drain electrode pads 4 as output surface electrodes (electrodes for wire connection) or output electrode pads. The drain electrode pads 4 are arranged in a row to constitute another electrode array (pad array) 4a, separately from the electrode array of the gate electrode pads 3. The gate electrode pads 3 are electrically connected to the gate electrodes (input electrodes) of MISFETs formed in the MISFET formation area 2, and the drain electrode pads 4 are electrically connected to the drain electrodes (output electrodes) of the MISFETs formed in the MISFET formation area 2. Although seven each of the gate electrode pads 3 and the drain electrode pads 4 are arranged in a row each in FIG. 1, the numbers of the gate electrode pads 3 and the drain electrode pads 4 are not limited to seven each, but can be altered as necessary. The source electrodes (ground electrodes) of the MISFETs formed in the MISFET formation area 2 are electrically connected to the conductor layers (rear electrodes) on the rear face of the semiconductor device 1.

As shown in FIG. 1, in this embodiment of the invention, the gate electrode pads 3 and the drain electrode pads 4 are arranged more densely in the parts near the center and more sparsely towards the ends of the side edges of the MISFET formation area 2. Thus, the intervals of the arrangement of the gate electrode pads 3 are shortened gradually (e.g. in an arithmetic series) from the both ends towards the center of the electrode array 3a of the gate electrode pads 3, and those of the arrangement of the drain electrode pads 4 are also shortened gradually (e.g. in an arithmetic series) from the both ends towards the center of the electrode array 4a of the drain electrode pads 4. Therefore, the pitch or intervals $W_{G1}$ and $W_{G2}$ of the gate electrode pads 3 in the central area of the side edges of the MISFET formation area 2 (central area of the electrode array 3a of the gate electrode pads 3) are shorter than the intervals $W_{G3}$ and $W_{G4}$ of the gate electrode pads 3 in the end areas of the side edges of the MISFET formation area 2 (end areas of the electrode array 3a of the gate electrode pads 3) ($W_{G1}, W_{G2} < W_{G3}, W_{G4}$) Similarly, the intervals $W_{D1}$ and $W_{D2}$ of the drain electrode pads 4 in the central area of the side edges of the MISFET formation area 2 (central area of the electrode array 4a of the drain electrode pads 4) are shorter than the intervals $W_{D3}$ and $W_{D4}$ of the drain electrode pads 4 in the end areas of the side edges of the MISFET formation area 2 (end areas of the electrode array 4a of the drain electrode pads 4) ($W_{D1}, W_{D2} < W_{D3}, W_{D4}$)

The gate electrode pads 3 and the drain electrode pads 4 are formed of metal wiring or the like permitting connection by bonding wires. Where bonding wires are used for connecting the gate electrode pads 3 and the drain electrode pads 4 to an external circuit, a usual automatic bonder can be used with the pads as markers, and the connecting process of the bonding wires is complicated in no way. As the bonding wires, aluminum wires can be used for instance.

Figure 2:
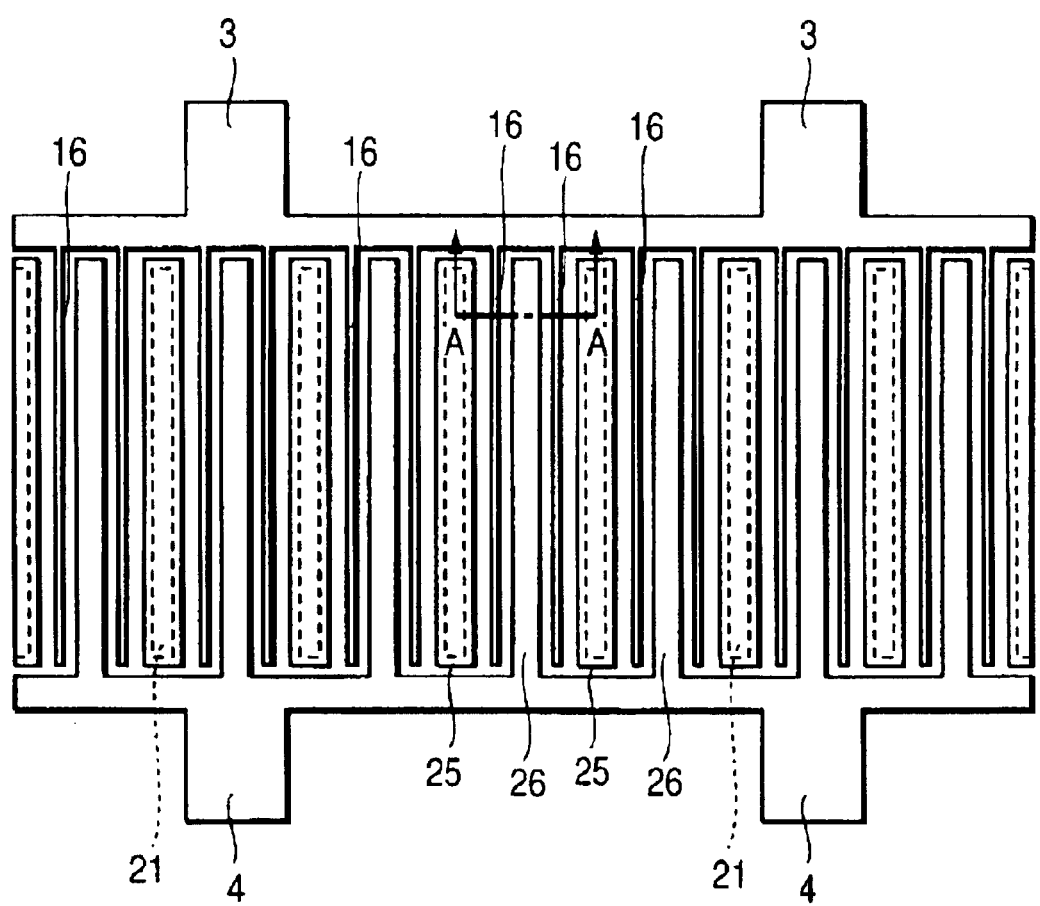
FIG. 2 is a conceptual plan showing essential parts of the semiconductor device of FIG. 1.

Next will be described the MISFETs formed in the semiconductor device 1. FIG. 2 is a conceptual plan showing essential parts of the semiconductor device of FIG. 1, and FIG. 3 shows a section along the A—A line in FIG. 1.

Figure 3:
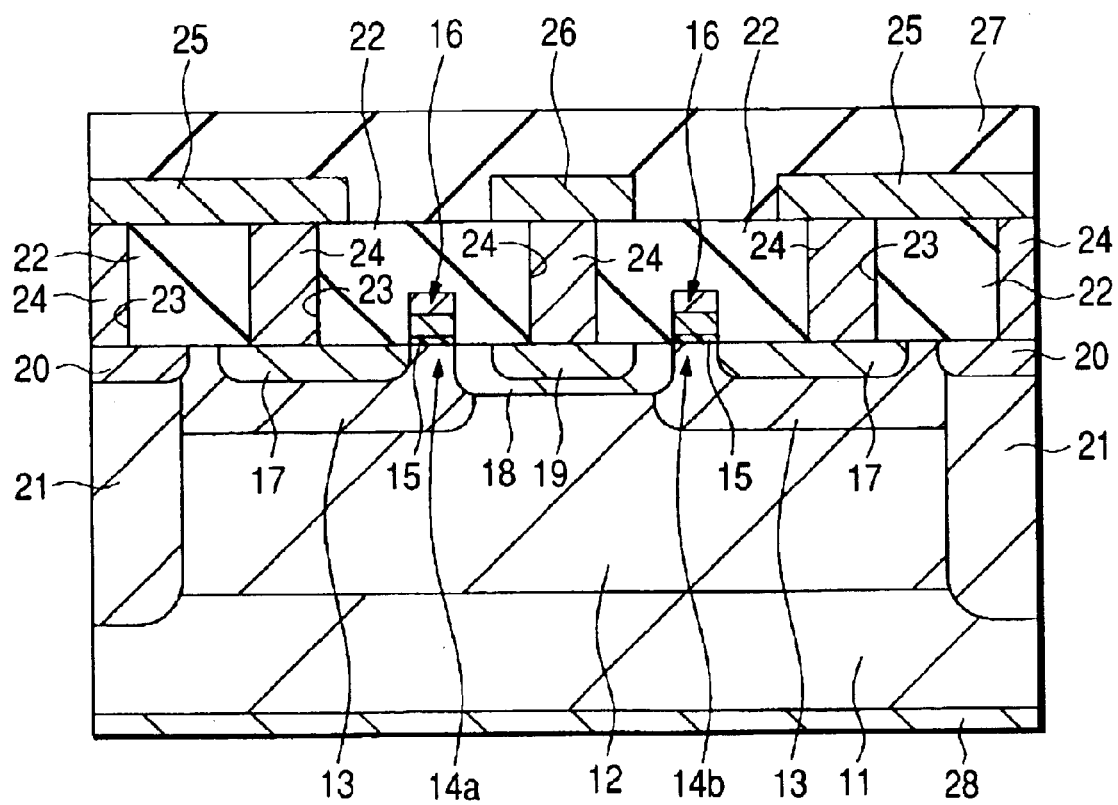
FIG. 3 shows a section along the A—A line in FIG. 2.

As shown in FIG. 3, a p⁻ type semiconductor layer (epitaxial silicon layer) 12 is epitaxially or otherwise formed over a semiconductor substrate 11 formed of p⁺ type monocrystalline silicon having a resistivity of 1 to 10 Ωcm, for instance. In the semiconductor layer 12, a p type well region 13 is formed by ion injection of an impurity, such as boron (B). Over the main face of the semiconductor substrate 11 (i.e. the main face of the semiconductor layer 12), n channel type MISFETs 14a and 14b are formed.

The gate insulating films 15 of the MISFETs 14a and 14b are formed of thin silicon oxide films, for instance, by thermal oxidation or otherwise. The gate electrodes (input electrodes) 16 of the MISFETs 14a and 14b are formed by patterning by photolithography and etching of a polycrystalline silicon film and a metal silicide layer (titanium silicide layer or cobalt silicide layer), for instance, formed over the main face of the semiconductor substrate 11.

In p type well regions 13 are formed n⁺ type semiconductor regions (n⁺ type diffusion layers) 17 as the source regions of the MISFETs 14a and 14b. A common drain region, shared by the MISFETs 14a and 14b, is formed between the gate electrode 16 of the MISFET 14a and the gate electrode 16 of the MISFET 14b, and has a lightly doped drain (LDD) structure having an n type semiconductor region (n⁻ type diffusion layer) 18 and an n⁺type semiconductor region (n⁺ type diffusion layer) 19 higher in impurity concentration than the region 18. The n+type semiconductor region 17, the n⁻ type semiconductor region 18 and the n⁺ type semiconductor region 19 can be formed by ion injection of an impurity, such as phosphorus (P).

In each of the p type well regions 13 is formed a p⁺ type semiconductor region (p⁺ type doped layer) 20 by ion injection of an impurity, such as boron (B). Underneath the p⁺ type semiconductor region 20, i.e. between the p⁺ type semiconductor region 20 and the semiconductor substrate 11, is formed a p⁺⁺ type semiconductor region (p⁺⁺ type punched region or p⁺⁺ type doped layer) 21 by ion injection of an impurity, such as boron (B). To add, the p⁺⁺ type semiconductor region 21 is formed to electrically connect a source electrode (25) with a conductor layer (28) on the rear face of the substrate, both to be described afterwards.

On the main face of the semiconductor substrate 11 is formed an insulating film 22 consisting of, for instance, a silicon oxide film, so as to cover the gate electrode 16. In the insulating film 22 are formed contact holes 23 to expose the n+ type semiconductor region 17, the n+ type semiconductor region 19 or the p+ type semiconductor region 20. In each contact hole 23 is embedded a plug 24 consisting of, for instance, a barrier film and a tungsten film.

Over the insulating film 22 are formed source electrodes (source wiring electrodes or ground electrodes) 25 to electrically connect the n+ type semiconductor region 17 and the p+ type semiconductor region 20 via the plugs 24 and drain electrodes (drain wiring electrodes or output electrodes) 26 to electrically connect the n+ type semiconductor region 19 via the plugs 24. The source electrodes 25 and the drain electrode 26 can be formed by, for instance, patternizing an aluminum alloy film or the like, formed over the insulating film 22, by photolithography and etching. The source electrodes 25 and the drain electrodes 26 can as well be formed by stacking a barrier film and an aluminum alloy film one over the other. Over the insulating film 22 is formed an insulating film 27 so as to cover the source electrodes 25 and the drain electrodes 26. To add, other wiring layers and inter-layer insulating films may also be formed over the insulating film 27 as required, but their illustration and description will be omitted here with a view to facilitation of understanding.

Over the rear face (face reversed to the main face) of the semiconductor substrate 11 is formed a conductor layer (rear electrode) 28 consisting of, for instance, a metal layer. As a result, the source electrodes 25 are electrically connected to the conductor layer 28 via plugs 24, the p+ type semiconductor region 20, the p++ type semiconductor region 21 and the semiconductor substrate 11.

The portion shown in FIG. 3 is the smallest unit of repetition, and the structure of FIG. 3 is repeated as many times as required to form a semiconductor amplifying element over the MISFET formation area 2. Therefore a plurality of unit semiconductor amplifying elements (unit semiconductor elements), or unit MISFETs (MISFETs 14a or MISFETs 14b) here, are connected in parallel to constitute a semiconductor amplifying element assembly (comprising all the MISFETs formed in the MISFET formation area 2) of the semiconductor device 1.

As shown in FIG. 2, the drain electrodes 26 of unit MISFETs extend in parallel to one another and are linked at one end of each to constitute a comb pattern, and connected to the drain electrode pads 4. The drain electrode pads 4 can be formed of drain electrodes 26 and their wiring layer, but the drain electrode pads 4 can as well be formed of another wiring layer connected to the drain electrodes 26 connected via through holes or the like.

Further, as shown in FIG. 2, the source electrodes 25 of the unit MISFETs extend substantially in parallel to the gate electrodes 16 and the drain electrodes 26 and, though not linked to one another, are electrically connected to the semiconductor substrate 11 and the conductor layer 28 via the p++ type semiconductor region 21 as shown in FIG. 3. Therefore, by connecting the conductor layer 28 to the reference potential or the ground potential, the source electrodes 25 of the unit MISFETs can be set to the reference potential or the ground potential. Further, as shown in FIG. 2, the gate electrodes 16 of the unit MISFETs extend substantially in parallel to one another and are linked at one end of each to constitute a comb pattern. The gate electrode pads 3 can as well be formed of a wiring layer connected to the gate electrodes 16 connected via through holes or the like. Incidentally, with a view to facilitation of understanding, the formation area or pattern of the gate electrode pads 3, the drain electrode pads 4, the gate electrode 16, the p++ type semiconductor region 21, the source electrodes 25 and the drain electrodes 26 are typically illustrated in FIG. 2, and the illustration of the rest of the structure is omitted.

Figure 4:
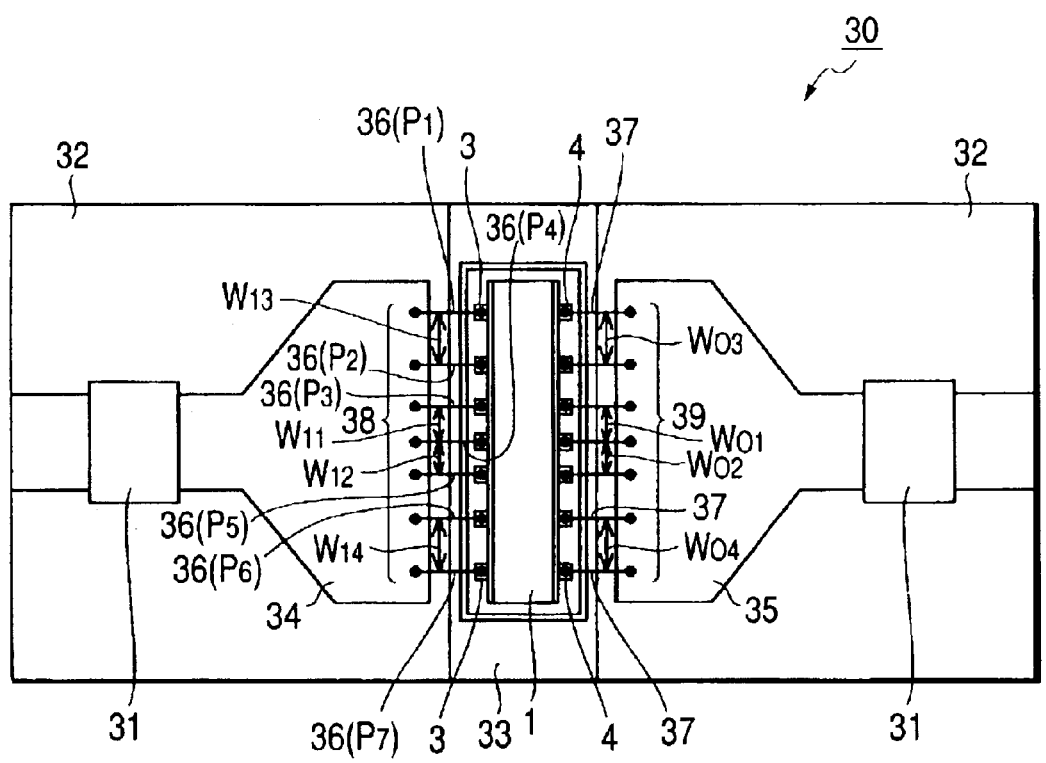
FIG. 4 is a schematic plan of an amplifier for high frequency use in which the semiconductor device of FIG. 1 is used.

FIG. 4 is a schematic plan of an amplifier for high frequency use of about 400 MHz or above (semiconductor device) 30 in which the semiconductor device (semiconductor chip) 1 of FIG. 1 is used.

The power amplifier 30 shown in FIG. 4 is a single-stage power amplifier, in which the semiconductor device 1 and circuit boards (wiring boards) 32 each having a matching circuit 31 are fixed to a supporting base 33.

Although seven each of the gate electrode pads 3 and the drain electrode pads 4 of the semiconductor device (semiconductor chip) 1 are also arranged in a row in the power amplifier 30 in FIG. 4, the numbers of the gate electrode pads 3 and the drain electrode pads 4 are not limited to seven each, but can be appropriately altered as necessary.

The input electrode pads of the power amplifier 30 are the gate electrode pads 3, and its output electrode pads are the drain electrode pads 4. The reference electrode or the ground electrode of the power amplifier 30 are the source electrodes 25 of the semiconductor device (semiconductor chip) 1, and are connected to the supporting base 33 of the reference potential or the ground potential supporting the circuit board 32 on the rear face of the semiconductor device (semiconductor chip) 1. Thus, the conductor layer 28 on the rear face of the semiconductor device 1 is electrically connected to the supporting base 33 of the ground potential. Also on the circuit board 32 are arranged or formed the input terminal 34 and the output terminal 35 in close proximity to the semiconductor device (semiconductor chip) 1.

The input terminal 34 and the gate electrode pads 3 are electrically connected by seven input side bonding wires 36, and the output terminal 35 and the drain electrode pads 4 are electrically connected by seven output side bonding wire 37. The input side bonding wires 36 are substantially equal in length, and the output side bonding wires 37 are also substantially equal in length.

The input side bonding wires 36 are arranged or connected in parallel to constitute a bonding wire array 38. The output side bonding wires 37 are arranged or connected in parallel to constitute a bonding wire array 39. In this mode of implementing the invention, since the gate electrode pads 3 and the drain electrode pads 4 formed on the semiconductor device (semiconductor chip) 1 are arranged densely in the central area and sparsely in the end areas as stated above, the bonding wires are arranged densely in the central area and sparsely in the end areas in the bonding wire arrays 38 and 39. Thus the intervals between the input side bonding wires 36 become gradually shorter from the both end areas towards the central area of the bonding wire array 38, and the intervals between the output side bonding wires 37 also become gradually shorter from the both end areas towards the central area of the bonding wire array 39. Therefore, the pitch or intervals $W_{I1}$ and $W_{I2}$ of the input side bonding wires 36 in the central area of the semiconductor device (semiconductor chip) 1 or the bonding wire array 38 are shorter than the intervals $W_{I3}$ and $W_{I4}$ of the input side bonding wires 36 in the end areas of the semiconductor device (semiconductor chip) 1 or the bonding wire array 38 ($W_{I1}$, $W_{I2} < W_{I3}$, $W_{I4}$). The intervals $W_{O1}$ and $W_{O2}$ of the output side bonding wires 37 in the central area of the semiconductor device (semiconductor chip) 1 or the bonding wire array 39 are shorter than the intervals $W_{O3}$ and $W_{O4}$ of the output side bonding wires 37 in the end areas of the semiconductor device (semiconductor chip) 1 or the bonding wire array 39 ($W_{O1}$, $W_{O2}$<$W_{O3}$, $W_{O4}$). As a result, the self-inductance of the bonding wire per unit gate width decreases towards the central part of the MISFET formation area 2.

Figure 5:
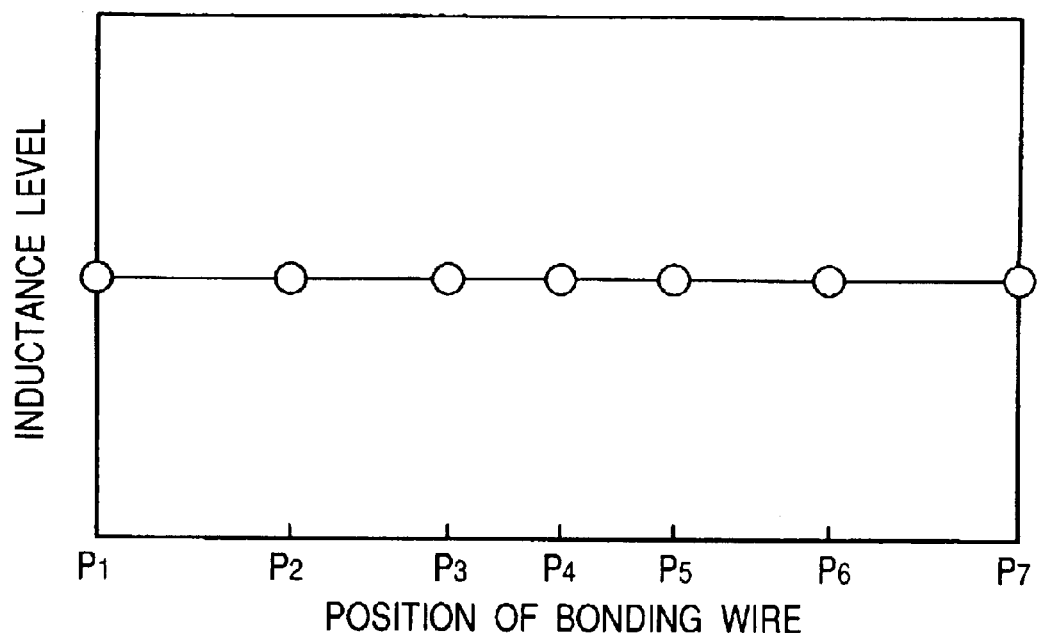
FIG. 5 is a graph showing the relationship between the position of the bonding wire and the inductance level.
Figure 6:
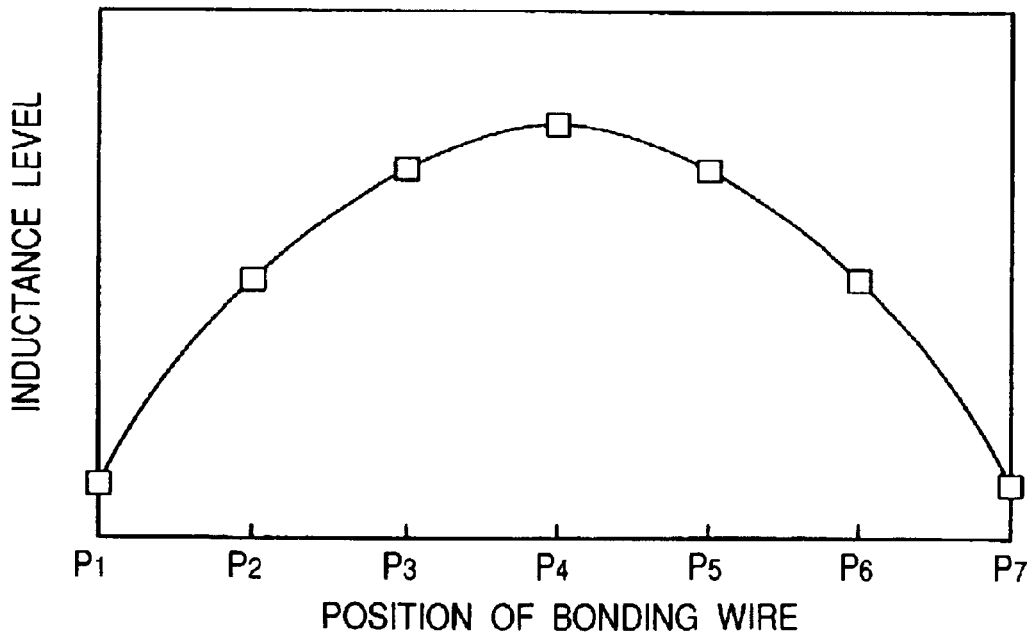
FIG. 6 is another graph showing the relationship between the position of the bonding wire and the inductance level.

FIG. 5 and FIG. 6 are graphs showing the relationship between the position of the bonding wire and the inductance level. The horizontal axes in the graphs of FIG. 5 and FIG. 6 represent the positions of the input side bonding wires 36 (i.e. the positions of the gate electrode pads 3) relative to the side edges of the MISFET formation area 2, and the vertical axes in the graphs of FIG. 5 and FIG. 6 represent the inductance level of the bonding wire in each position. On the horizontal axes in the graphs of FIG. 5 and FIG. 6, $P_1$ and $P_7$ represent the bonding wire positions at the both ends of the bonding wire array 38, and $P_4$, the bonding wire position at the center of the bonding wire array 38. FIG. 5 shows a case in which, as in this mode of implementation, the input side bonding wires 36 (i.e. the gate electrode pads 3) are arranged with the intervals between bonding wires shorter in the central area of the bonding wire array 38 and longer towards the end areas and the lengths of the bonding wires being equalized (where $W_{G1}$, $W_{G2}$<$W_{G3}$, $W_{G4}$; $W_{I1}$, $W_{I2}$<$W_{I3}$, $W_{I4}$). FIG. 6 shows a comparative case in which the gate electrode pads 3 (i.e. the input side bonding wires 36) are arranged at equal intervals and the lengths of the bonding wires 36 are equalized (where $W_{G1}$=$W_{G2}$=$W_{G3}$=$W_{G4}$, $W_{I1}$=$W_{I2}$=$W_{I3}$=$W_{I4}$). Both in FIG. 5 and FIG. 6, the number of input side bonding wires is seven.

It is seen in FIG. 6 that the inductance levels of the bonding wires in different positions ($P_1$ through $P_7$) are unevenly distributed, higher in the central area ($P_4$) of the side edges of the MISFET formation area 2 than in the end areas ($P_1$ and $P_7$). This reflects the mutual inductances of the bonding wires. This unevenness of inductance can occur not only on the input side (gate electrode side) but also on the output side (drain electrode side). Therefore, if drain electrode pads are arranged at equal intervals, the inductances of the bonding wires connecting the drain electrode pads and the output terminal will also be unevenly distributed in substantially the same way as in FIG. 6. This unevenness of inductance dependent on the bonding wire position becomes more conspicuous with an increase in total gate width, and the resultant unevenness of the operating states of unit MISFETs invites drops in gain and efficiency.

In this mode of implementing the invention, the gate electrode pads 3 (i.e. the input side bonding wires 36) are arranged at shorter intervals in the central area of the side edges of the MISFET formation area 2 and at longer intervals in the end parts of the same. As a result, the self-inductance of the bonding wire 36 per unit gate width decreases towards the central part of the MISFET formation area 2. This enables the unevenness in inductance distribution dependent on the position of the bonding wire of an equal length as shown in FIG. 6 to be eliminated and instead an even distribution of inductance to be realized, independent of the bonding wire position as shown in FIG. 5. Similarly, by arranging the drain electrode pads 4 (i.e. the output side bonding wires 37) at shorter intervals in the central part of the MISFET formation area 2 and at longer intervals towards the end parts, the unevenness in inductance distribution dependent on the position of the bonding wire of an equal length as shown in FIG. 6 can be eliminated and instead an even distribution of inductance, independent of the bonding wire position as shown in FIG. 5, can be realized.

Since the power amplifier 30 can eliminate the unevenness of the inductances of bonding wires due to mutual inductance, this configuration can prevent the high frequency characteristics of the semiconductor amplifying elements from deteriorating.

As described so far, in this mode of implementation, in order to compensate for the inductance unevenness of bonding wires shown in the graph of FIG. 6, the arrangement of the gate electrode pads (input electrode pads) 3 and the drain electrode pads (output electrode pads) 4 of the semiconductor device (semiconductor chip) 1 is adjusted. Thus, the intervals of the gate electrode pads 3 and the intervals of the drain electrode pads 4 are gradually shortened from the end parts towards the central parts of the electrode arrays 3a and 4a. This enables the inductances of the input side bonding wires 36 connected to the gate electrode pads 3 and the inductances of the output side bonding wires 37 connected to the drain electrode pads 4 to be uniformized. As a result, the gate inductances of the input electrodes and the drain inductances of the output electrodes of the semiconductor device can be uniformized within the semiconductor device 1. In such a semiconductor device 1, the operations of the unit MISFETs are uniformized, and the operations of the whole MISFET assembly (semiconductor amplifying elements) can be thereby uniformized. Thus, the problem of deterioration in the overall output, gain, efficiency or distortion characteristics of the semiconductor device (semiconductor amplifying element) due to unevenness in current, voltage phase or amplitude can be addressed and solved. This makes it possible to provide a semiconductor amplifying device with a high gain, high efficiency or low distortion.

Moreover, as the performance of the semiconductor amplifying element can be improved, the gate width required for obtaining the same output can be reduced. As a result, it is made possible to reduce the size of the semiconductor device (semiconductor amplifying element chip).

Furthermore, in this mode of implementation, there is no need to adjust the lengths of the bonding wires. For this reason, the bonding wires can be shortened, but no long bonding wires are required. Therefore, the packaging area of the semiconductor device (semiconductor chip) can be reduced. It is also possible to reduce the size of the semiconductor device or the semiconductor package mounted with a semiconductor chip. The invention can be applied with particular effectiveness to semiconductor amplifying element chips whose size is to be increased to achieve a higher output.

To add, although the numbers of the gate electrode pads 3 and drain electrode bands 4 are seven each and the bonding wires 36 and 37 are connected matched with the pads in this mode of implementation, the numbers of bonding wires (or the numbers of pads) need not be the same between the input side and the output side. Nor are the numbers of the gate electrode pads 3, the drain electrode pads 4, and the bonding wires 36 and 37 restricted to those in this mode of implementation.

In this mode of implementation, the intervals at which the gate electrode pads 3 are arranged are gradually shortened from the end parts towards the central part of the array of the gate electrode pads 3. However, it is also acceptable to have a mixture of an arrangement in which the intervals of the gate electrode pads 3 are shortened from the end areas towards the central part of the array of the gate electrode pads 3 with an arrangement at equal intervals (or an arrangement of somewhat increasing intervals). Alternatively, the intervals of the gate electrode pads 3 can as well be substantially equalized in a prescribed range from the center of the array of the gate electrode pads 3 and expanded in prescribed areas towards the ends of the array of the gate electrode pads 3. In this mode of implementation, the intervals $W_{G1}$ and $W_{G2}$ (or the pitch) of the gate electrode pads 3 in at least the central area of the electrode array 3a are shorter than the intervals $W_{G3}$ and $W_{G4}$ (or the pitch) of the gate electrode pads 3 in the end areas of the array of the gate electrode pads 3. This is also true of the drain electrode pads 4.

(Embodiment 2)

In Embodiment 1 described above, by adjusting the arrangement of the gate electrode pads 3 and the drain electrode pads 4, the unevenness of the inductances of the bonding wires connected thereto is eliminated. However, the present inventors also made a study on electromagnetic couplings of other elements than the input/output wiring.

Figure 7:
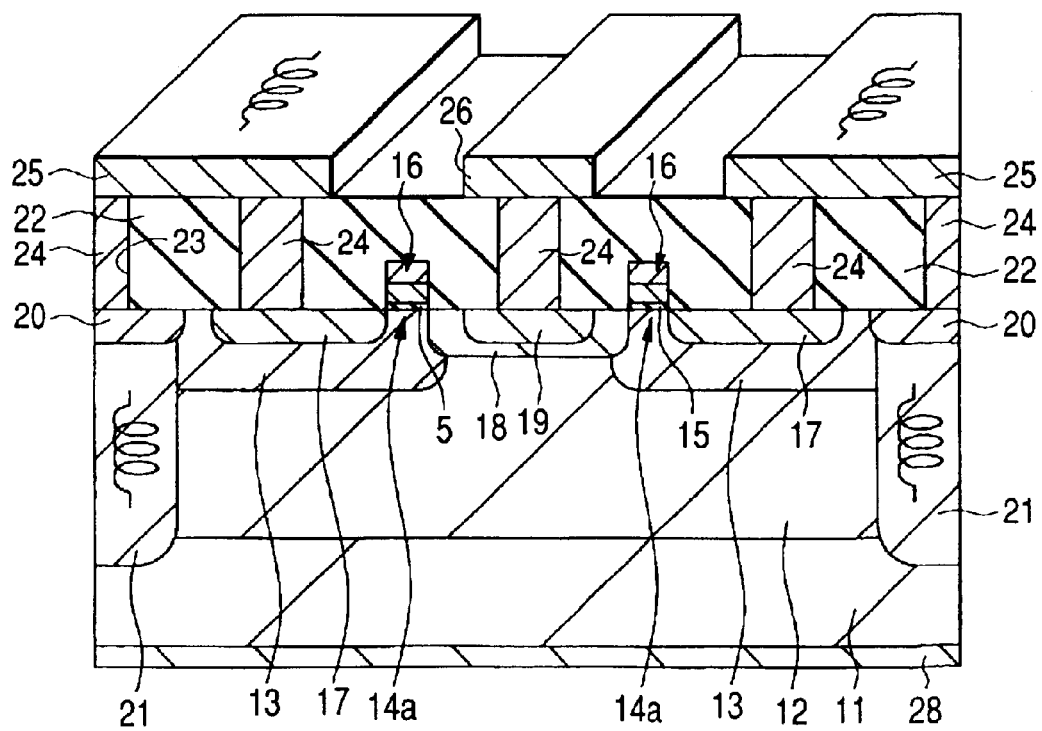
FIG. 7 is a diagram for explaining the source inductances of the semiconductor device.

FIG. 7 is a diagram for explaining the source inductances of the semiconductor device. Incidentally, as FIG. 7 matches the structure illustrated in FIG. 3, description of constituents herein will be omitted. As is seen from FIG. 7, inductance components (source inductances) are formed in the source electrodes 25 and the $p^{++}$ type semiconductor region 21.

The study by the inventors revealed the existence of unevenness of the source inductances of the source electrodes (source wiring electrodes or ground electrodes) 25 and the $p^{++}$ type semiconductor region 21 (punched region or doped region connecting the source electrodes 25 and the conductor layer 28 on the rear face of the chip) due to the electromagnetic couplings among the inductances (mutual inductances), similarly to the unevenness of inductances found in the array of bonding wires as shown in FIG. 6. It was also found that the mutual inductance of source inductances was partly accountable for the drop in gain or efficiency with an increase in the total gate width. Thus, source inductances are increased in the whole MISFET assembly under the influence of their mutual inductance, and their distribution is made uneven. As a result, the gain of the MISFET drops, and the operating states of the unit MISFETs constituting the MISFET are made uneven, giving rise to a fear of deterioration in high frequency characteristics (including the output power, gain, efficiency and distortion).

For this mode of implementation, the possibility of eliminating the unevenness of source inductances was also considered.

Figure 8:
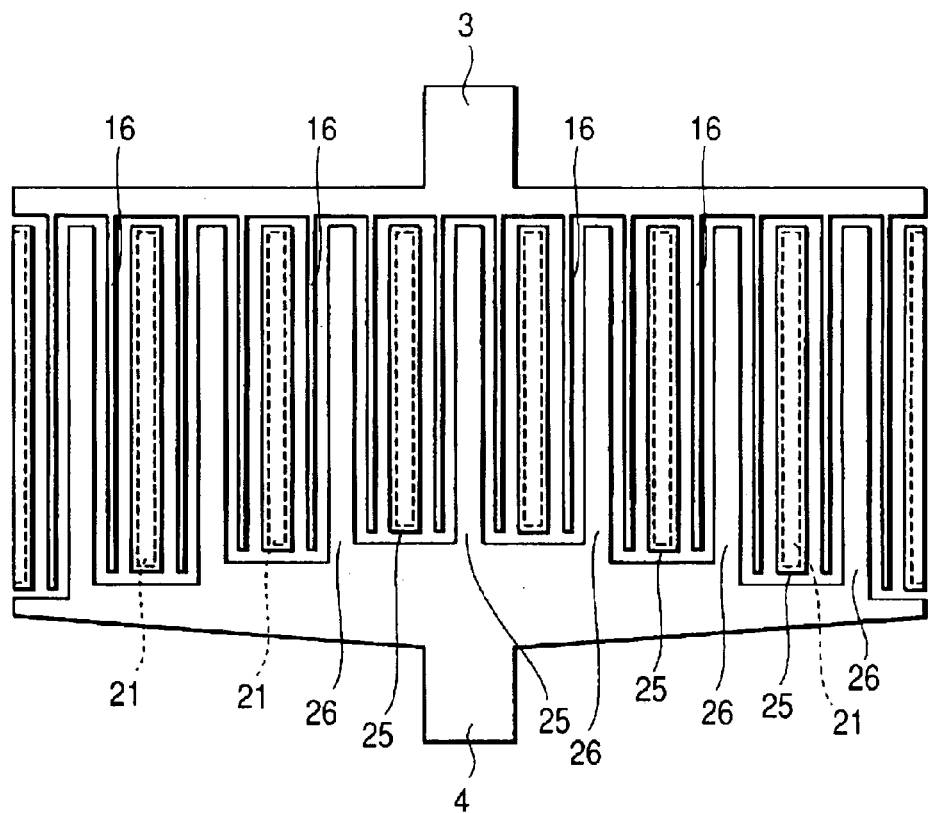
FIG. 8 is a conceptual plan showing essential parts of a semiconductor device, which is another preferred embodiment of the invention.

FIG. 8 is a conceptual plan showing essential parts of a semiconductor device, which is Embodiment 2 of the invention. FIG. 8 mostly matches FIG. 2 which illustrates Embodiment 1 of the invention described above. Therefore in FIG. 8 as well, the formation area or pattern of the gate electrode pad 3, the drain electrode pad 4, the gate electrodes 16, the $p^{++}$ type semiconductor regions 21, the source electrodes 25 and the drain electrodes 26 is typically shown, and illustration of the rest of the structure is omitted.

A semiconductor device (semiconductor chip) in this mode of implementation, like the semiconductor device 1 which is Embodiment 1, is a high frequency power amplifying element chip or a semiconductor amplifying device for use at, for example, a high frequency of approximately 400 MHz or above, and on its inside or its surface layer is formed a MISFET consisting of a plurality of unit MISFETs connected in parallel, but detailed description of the constituent elements of the unit MISFETs is omitted here because they are substantially the same as their respective counterparts in Embodiment 1 described above.

In this mode of implementation, as shown in FIG. 8, a plurality (14 in FIG. 8) of unit MISFETs each consisting of a gate electrode (input electrode) 16, a source electrode (ground electrode) 25 and a drain electrode (output electrode) 26 are connected in parallel, a gate electrode pad 3 as the input surface electrode (input electrode pad) being connected to the gate electrodes 16 and a drain electrode pad 4 as the output surface electrode (output electrode pad) being connected to the drain electrodes 26. To add, although the number of unit MISFETs to be connected in parallel is supposed to be 14 and those of the gate electrode pad 3 and the drain electrode pad 4 to be one each in this mode of implementation, the invention is not restricted to these numbers, which can be altered as necessary.

As is seen from FIG. 8, in this mode of implementation, the source electrodes 25 and the $p^{++}$ type semiconductor regions 21 of the unit MISFETs are adjusted from position to position. Thus, the unit MISFETs constituting the MISFET formed in the MISFET formation area 2 are so formed that those in the central part of the MISFET formation area 2 be shorter in the length of the source electrode 25 (length of the source electrode 25 in its extending direction) than in the end parts of the same. In FIG. 8, the lengths of the source electrodes 25 of the unit MISFETs gradually decrease from the unit MISFETs at both ends towards the unit MISFETs in the central part. By adjusting the lengths of the source electrodes 25 in this way, the aforementioned unevenness in source inductance level attributable to the source electrodes 25 can be regulated.

Thus, by making the lengths of the source electrodes 25 of the unit MISFETs shorter in the end areas than in the central area, the mutual inductance between the adjoining source electrodes 25 in the central area, which are strongly coupled to each other, is reduced, and the inductance per unit gate width is thereby reduced. The problems of the aforementioned unevenness of the source inductance levels between the central and end areas and of the increase in the overall inductance of the semiconductor amplifying element due to the mutual inductance can be eliminated to realize uniform operations of the unit MISFETs.

In this mode of implementation, there is provided a semiconductor device (semiconductor amplifying element chip) in which the lengths of the source electrodes of the semiconductor amplifying element are adjusted to compensate for the unevenness of inductances due to the mutual inductance as shown in the graph of FIG. 6 regarding source inductances as well. This makes it possible to uniformize the source inductances of the ground electrodes within the semiconductor chip.

In such a semiconductor device (semiconductor amplifying element), the overall operations of the semiconductor device (semiconductor amplifying element) can be uniformized, the problem of deterioration in the output, gain, efficiency or distortion characteristics of the semiconductor amplifying element chip due to unevenness in current, voltage phase or amplitude can be addressed and solved, and at the same time the gain, output or efficiency can be enhanced by reducing the source inductances. Also, the uniformization inside the semiconductor amplifying element makes it possible at the same time to set the whole semiconductor amplifying element to its optimal impedance, its operating state can be uniformized and impedance matching can be achieved with little loss.

Also, as the performance of the semiconductor amplifying element can be improved, the gate width required for obtaining the same output can be reduced, and accordingly it is made possible to reduce the size of the semiconductor device (semiconductor amplifying element chip).

Further, although the numbers of the gate electrode pad 3 and the drain electrode pad 4 are one each in this mode of implementation, a plurality each of the gate electrode pads 3 and the drain electrode pads 4 may as well be provided. In this case, although the intervals between the plurality of the gate electrode pads 3 and the plurality of the drain electrode pads 4 may be equal, the intervals may be so adjusted as to become shorter from the end areas towards the central area of the electrode array as in Embodiment 1 described above.
(Embodiment 3)

Figure 9:
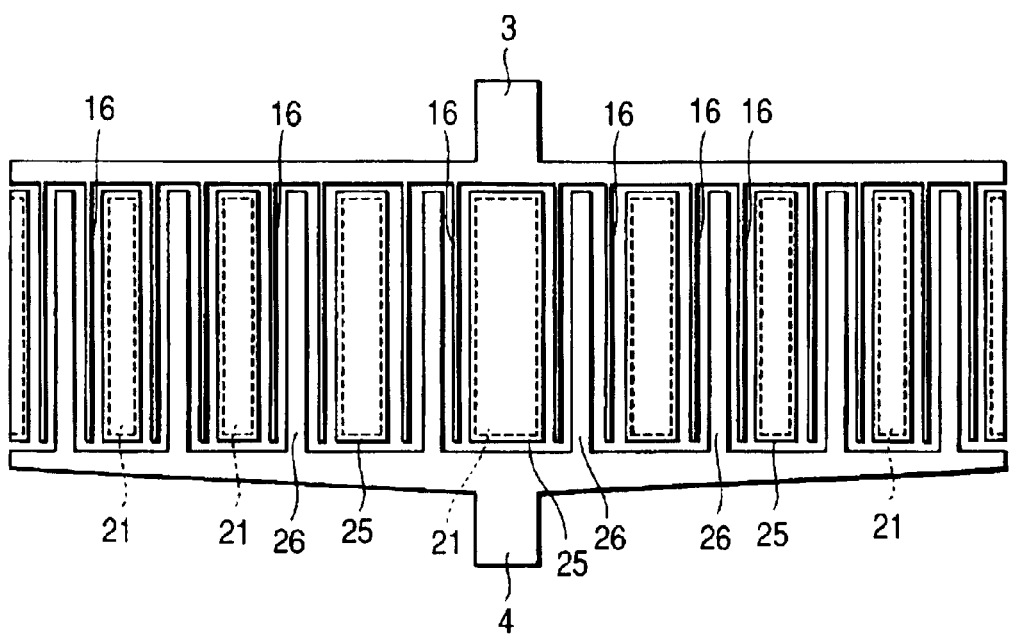
FIG. 9 is a conceptual plan showing essential parts of a semiconductor device, which is still another preferred embodiment of the invention.

FIG. 9 is a conceptual plan showing essential parts of a semiconductor device, which is Embodiment 3 of the invention. FIG. 9 mostly matches FIG. 2 illustrating Embodiment 1 of the invention described above. Therefore in FIG. 9 as well, the formation area or pattern of the gate electrode pad 3, the drain electrode pad 4, the gate electrodes 16, the $p^{++}$ type semiconductor regions 21, the source electrodes 25 and the drain electrodes 26 is typically shown, and illustration of the rest of the structure is omitted.

A semiconductor device (semiconductor chip) in this mode of implementation, like the semiconductor device which is Embodiment 1 or 2, is a high frequency power amplifying element chip or a semiconductor amplifying device for use at, for example, a high frequency of approximately 400 MHz or above, and on its inside or its surface layer is formed a MISFET consisting of a plurality of unit MISFETs connected in parallel, but detailed description of the constituent elements of the unit MISFETs is dispensed with here because they are substantially the same as their respective counterparts in Embodiment 1 described above.

In this mode of implementation, as shown in FIG. 9, a plurality (16 in FIG. 9) of unit MISFETs each consisting of a gate electrode (input electrode) 16, a source electrode (ground electrode) 25 and a drain electrode (output electrode) 26 are connected in parallel, a gate electrode pad 3 as the input surface electrode (input electrode pad) being connected to the gate electrodes 16 and a drain electrode pad 4 as the output surface electrode (output electrode pad) being connected to the drain electrodes 26. To add, although the number of unit MISFETs to be connected in parallel is supposed to be 16 and those of the gate electrode pad 3 and the drain electrode pad 4 to be one each in this mode of implementation, the invention is not restricted to these numbers, which can be altered as necessary.

As is seen from FIG. 9, in this mode of implementation, the source electrodes 25 and the $p^{++}$ type semiconductor regions 21 of the unit MISFETs are adjusted from position to position. Thus, the unit MISFETs constituting the MISFET formed in the MISFET formation area 2 are so formed that those in the central part of the MISFET formation area 2 be greater in the width of the source electrode 25 (source electrode 25 normal to its extending direction is wider) than in the end parts of the same and in the width of the $p^{++}$ type semiconductor region 21 ($p^{++}$ type semiconductor regions 21 normal to the extending direction of the source electrode 25 is wider). In FIG. 9, the widths of the source electrodes 25 and the $p^{++}$ type semiconductor regions 21 of the unit MISFETs gradually decrease from the unit MISFETs at both ends towards the unit MISFETs in the central part. By adjusting the widths of the source electrodes 25 and the $p^{++}$ type semiconductor regions 21 in this way, the aforementioned unevenness in source inductance level attributable to the source electrodes 25 and the $p^{++}$ type semiconductor regions 21 can be regulated.

Thus, by making the widths of the source electrodes 25 of the unit MISFETs greater in the central area than in the end areas and also those of the $p^{++}$ type semiconductor regions 21 greater in the central area than in the end areas, the self-inductance in the central area is reduced and so is the mutual inductance between the adjoining source electrodes 25 in the central area, which are strongly coupled to each other. The problems of the aforementioned unevenness of the source inductance levels between the central and end areas and of the increase in the overall inductance of the semiconductor amplifying element can be eliminated as in Embodiment 2 described above to realize uniform operations of the unit MISFETs.

In this mode of implementation, there is provided a semiconductor device (semiconductor amplifying element chip) in which the widths of the source electrodes and the areas (widths) and of the $p^{++}$ type semiconductor regions 21 of the semiconductor amplifying element are adjusted to compensate for the unevenness of inductances due to the mutual inductance of source inductances. This makes it possible to uniformize the source inductances of the ground electrodes within the semiconductor chip.

In such a semiconductor device (semiconductor amplifying element), the overall operations of the semiconductor device (semiconductor amplifying element) can be uniformized, the problem of deterioration in the output, gain, efficiency or distortion characteristics of the semiconductor amplifying element chip due to unevenness in current, voltage phase or amplitude can be addressed and solved, and at the same time the gain, output or efficiency can be enhanced by reducing the source inductances. Also, the uniformization inside the semiconductor amplifying element makes it possible at the same time to set the whole semiconductor amplifying element to its optimal impedance, its operating state can be uniformized and impedance matching can be achieved with little loss.

Also, as the performance of the semiconductor amplifying element can be improved, the gate width required for obtaining the same output can be reduced, and accordingly it is made possible to reduce the size of the semiconductor device (semiconductor amplifying element chip).

Although the influence of the mutual inductance between source inductances is considered, and adjustment made for, with respect to both the source electrodes 25 and the $p^{++}$ type semiconductor regions 21 in this mode of implementation, a semiconductor device (semiconductor amplifying element) in which the adjustment covers only either of the source electrodes 25 and the $p^{++}$ type semiconductor regions 21 can be expected to have a similar effect to that of this embodiment, which of course would be included in the scope of the present invention.

Although the numbers of the gate electrode pad 3 and the drain electrode pad 4 are one each in this mode of implementation, a plurality each of the gate electrode pads 3 and the drain electrode pads 4 may as well be provided. In this case, the intervals between the plurality of the gate electrode pads 3 and the plurality of the drain electrode pads 4 may be either equal or so adjusted as to become shorter from the end parts towards the central part of the electrode array as in Embodiment 1 described above.
(Embodiment 4)

In the modes of implementing the invention described so far, a MISFET is formed in the semiconductor device 1 as the semiconductor amplifying element (semiconductor element), but in this mode of implementation now to be described, a bipolar transistor, for instance a heterojunction bipolar transistor (HBT), is formed on the semiconductor device as the semiconductor amplifying element (semiconductor element).

Figure 10:
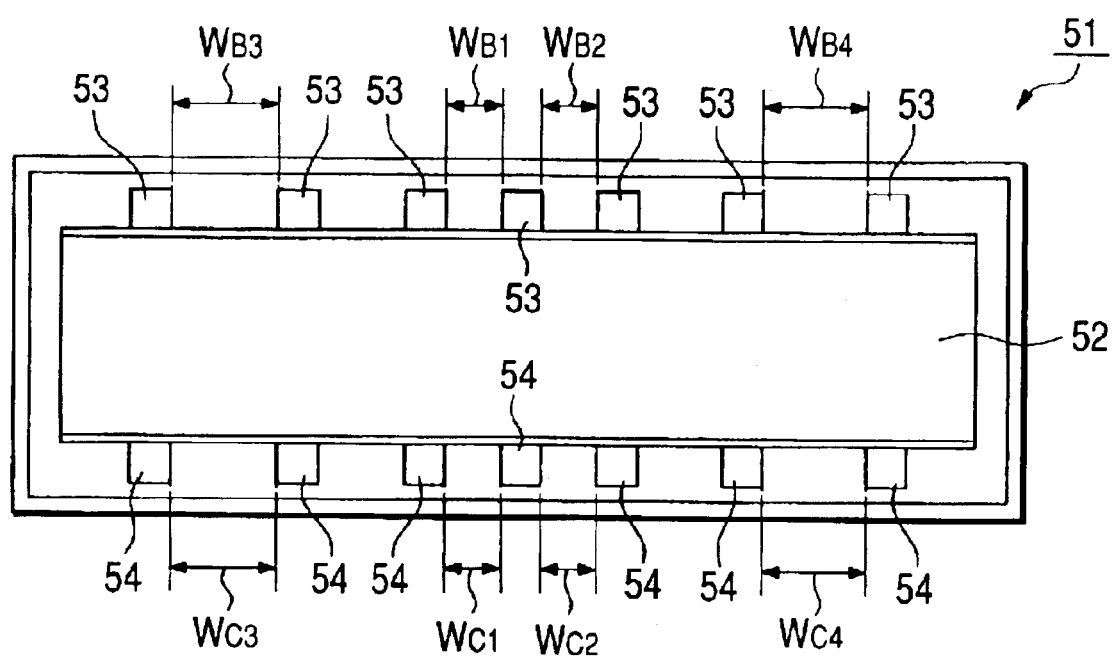
FIG. 10 is a plan showing an overall view of a semiconductor device, which is yet another preferred embodiment of the invention, from above.

FIG. 10 is a plan showing an overall view of a semiconductor device in this mode of implementing the invention from above.

A semiconductor device (semiconductor chip) 51 in this mode of implementation shown in FIG. 10 is a high frequency power amplifying element chip or a semiconductor amplifying device for use at, for example, a high frequency of approximately 400 MHz or above, and on its inside or its surface layer are formed bipolar transistors, such as HBTs. On one of the two side edges of an HBT formation area (semiconductor element formation area or semiconductor amplifying element formation area) 52, which is the area in which the HBTs are formed, base electrode pads 53 are formed as the input surface electrodes (electrodes for wire connection) or the input electrode pads, on the other edge are formed collector electrode pads 54 as the output surface electrodes (electrodes for wire connection) or the output electrode pads, both arranged in a row each. The base electrode pads 53 are electrically connected to the base electrodes (input electrodes) of the HBTs formed in the HBT formation area 52, and the collector electrode pads 54 are electrically connected to the collector electrodes (output electrodes) of the HBTs formed in the HBT formation area 52. Although seven each of base electrode pads 53 and collector electrode pads 54 are arranged in a row each in FIG. 10, the numbers of the base electrode pads 53 and the collector electrode pads 54 are not restricted to seven each, but can be altered as required. The emitter electrodes (ground electrodes) of the HBTs formed in the HBT formation area 52 are electrically connected to a conductor layer (rear electrode) formed on the rear face of the semiconductor device 51.

Figure 11:
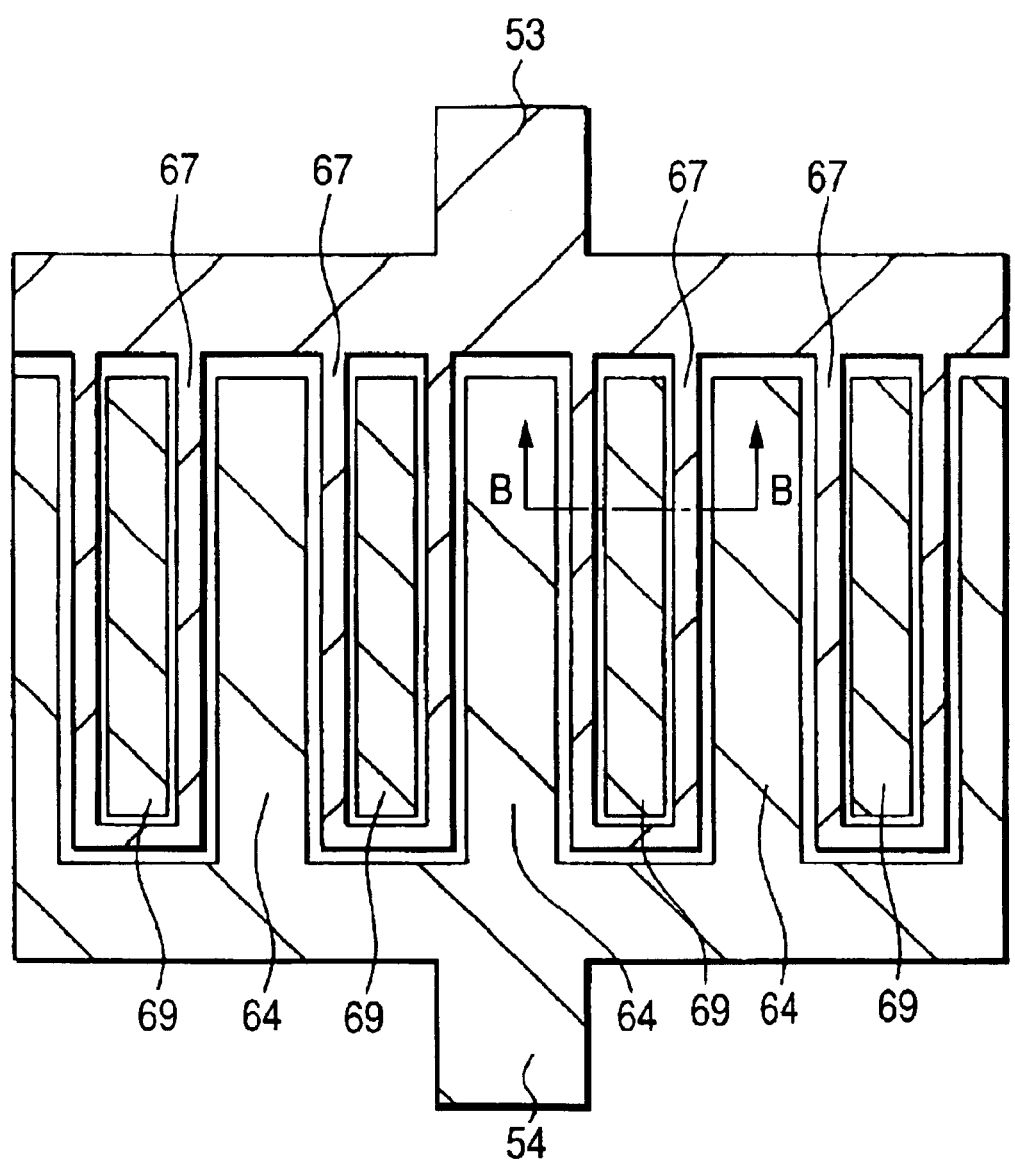
FIG. 11 is a conceptual plan showing essential parts of the semiconductor device of FIG. 10.
Figure 12:
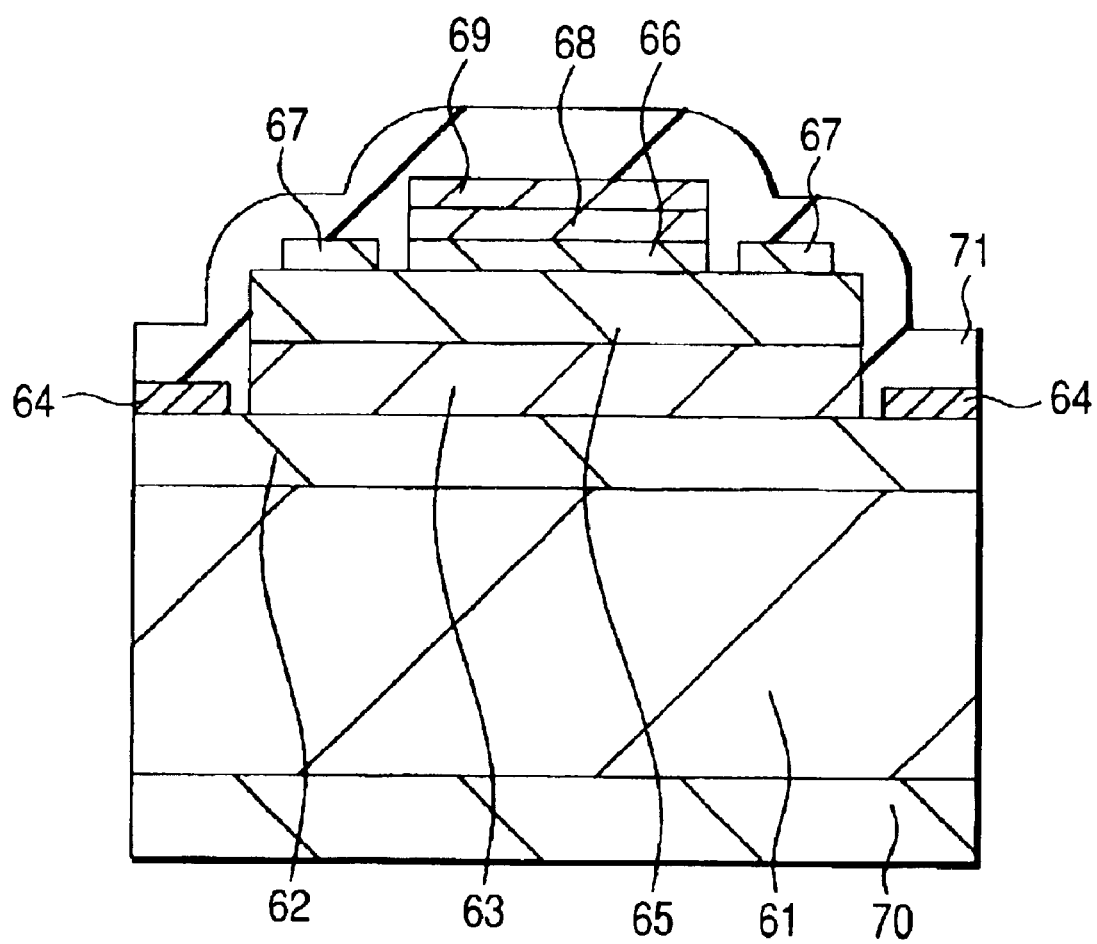
FIG. 12 shows a section along the B—B line in FIG. 11.

FIG. 11 is a conceptual plan showing essential parts of the semiconductor device in this mode of implementation, and FIG. 12 shows a section along the B—B line in FIG. 11. FIG. 11 and FIG. 12 respectively correspond to FIG. 2 and FIG. 3 of Embodiment 1 described above.

As shown in FIG. 12, an n type subcollector layer (first semiconductor layer) 62 is formed over a substrate 61 consisting of a semi-insulating chemical compound, such as gallium arsenide. Over the n type subcollector layer 62 are formed an n type collector layer 63 and collector electrodes 64. Over the n type collector layer 63 is formed a p type base layer 65. Over the p type base layer 65 are formed an n type emitter layer 66 and base electrodes 67. Over the n type emitter layer 66 is formed a cap layer 68m and over the cap layer 68 are formed emitter electrodes 69. On the rear face of the substrate 61 is formed a rear electrode layer 70 electrically connected to the emitter electrodes 69 in an area not shown. By connecting the rear electrode layer 70 to the supporting base of the ground potential or the like, the emitter electrodes 69 can be set to the ground potential.

The subcollector layer 62 consists of a chemical compound semiconductor, such as gallium arsenide, doped with silicon (Si), for instance; the collector layer 63 consists of a chemical compound semiconductor, such as gallium arsenide, doped with silicon, for instance; and the base layer 65 consists of a chemical compound semiconductor, such as gallium arsenide, doped with carbon, for instance. The emitter layer 66 is a laminated crystalline layer consists of, for instance, indium gallium phosphide (InGaP) and gallium arsenide formed over it and doped with silicon (Si), for instance, and the cap layer 68 consists of a chemical compound semiconductor, such as indium gallium arsenide (InGaAs). The base electrodes 67 consist of, for instance, a platinum (Pt)/titanium (Ti)/gold (Au)-based alloy layer. The collector electrodes 64 consist of, for instance a gold germanium (AuGe)/nickel (Ni)/gold (Au)-based alloy layer. The emitter electrodes 69 consists of, for instance, a silicide layer, such as tungsten silicide ($WSi_x$).

Over the main face the substrate 61 is formed, so as to cover the constituent elements mentioned above, an insulating film 71 consisting of silicon oxide ($SiO_x$) or the like. Through holes are bored in the insulating film 71 as required to form a wiring layer for electrically connecting the base electrodes 67, the collector electrodes 64 or the emitter electrodes 69, but their illustration and description will be omitted here to facilitate understanding.

The portion shown in FIG. 12 is the smallest unit of repetition and, as shown in FIG. 11, the structure of FIG. 12 is repeated as many times as required to form a semiconductor amplifying element (HBT) over the HBT formation area 52. Therefore a plurality of unit semiconductor amplifying elements (unit semiconductor elements), or unit HBTs (each being the HBT shown in FIG. 12) here, are connected in parallel to constitute a semiconductor amplifying element assembly (comprising all the HBTs formed in the HBT formation area 52) of the semiconductor device 51 in this mode of implementation. Incidentally, with a view to facilitation of understanding, the formation area or pattern of the base electrode pads 53, the collector electrode pads 54, the collector electrodes 64, the base electrodes 67 and the emitter electrodes 69 are typically illustrated in FIG. 11, and the illustration of the rest of the structure is omitted.

Similarly to the gate electrode pads 3 and the drain electrode pads 4 in Embodiment 1 described above, also in this mode of implementation, the base electrode pads 53 and the collector electrode pads 54 are arranged more densely in the parts near the center and more sparsely towards the ends of the side edges of the HBT formation area 52 as shown in FIG. 10. In FIG. 10, the intervals of the arrangement of the base electrode pads 53 become gradually shorter from the two edge areas to the central area of the electrode array, and those of the arrangement of the collector electrode pads 54 also intervals become gradually shorter from the two edge areas to the central area of the electrode array. Therefore, the pitch or intervals $W_{B1}$ and $W_{B2}$ of the base electrode pads 53 in the central area of the side edges of the HBT formation area 52 (central area of the electrode array) are shorter than the intervals $W_{B3}$ and $W_{B4}$ of the base electrode pads 53 in the end areas of the side edges of the HBT formation area 52 (end areas of the electrode array) ($W_{B1}$, $W_{B2}$<$W_{B3}$, $W_{B4}$) Similarly, the intervals $W_{C1}$ and $W_{C2}$ of the collector electrode pads 54 in the central area of the side edges of the HBT formation area 52 (central area of the electrode array) are shorter than the intervals $W_{C3}$ and $W_{C4}$ of the collector electrode pads 54 in the end areas of the side edges of the HBT formation area 52 (end areas of the electrode array) ($W_{C1}$, $W_{C2}$<$W_{C3}$, $W_{C4}$).

Other aspects of the configuration can be the same as their respective counterparts in Embodiment 1 described above, and will not be described in detail here.

In the semiconductor device in this mode of implementation, too, as in Embodiment 1 described above, the inductances of the bonding wires connected to the base electrode pads 53 and the collector electrode pads 54 can be uniformized, and so can be the operating states of the unit HBTs. As a result, the overall operation of the semiconductor device (semiconductor amplifying element) can be uniformed. The overall output, gain, efficiency or distortion characteristics of the semiconductor device (semiconductor amplifying element) can be improved. Moreover, since there is no need for adjusting the lengths of the bonding wires, the packaging area of the semiconductor device (semiconductor chip) can be reduced.

(Embodiment 5)

Regarding this embodiment, an internally matching circuit type package 81, which is a power amplifier for use in 2 GHz band mobile telephone base stations, packaged with a semiconductor device (semiconductor chip) 80, which is substantially similar to the semiconductor device (semiconductor chip) 1 in the first mode of implementing the invention, will be described. Since this package is required to provide a very high output, such as 250 W, the total gate width of MISFETs used as power amplifying elements is extremely great.

Figure 13:
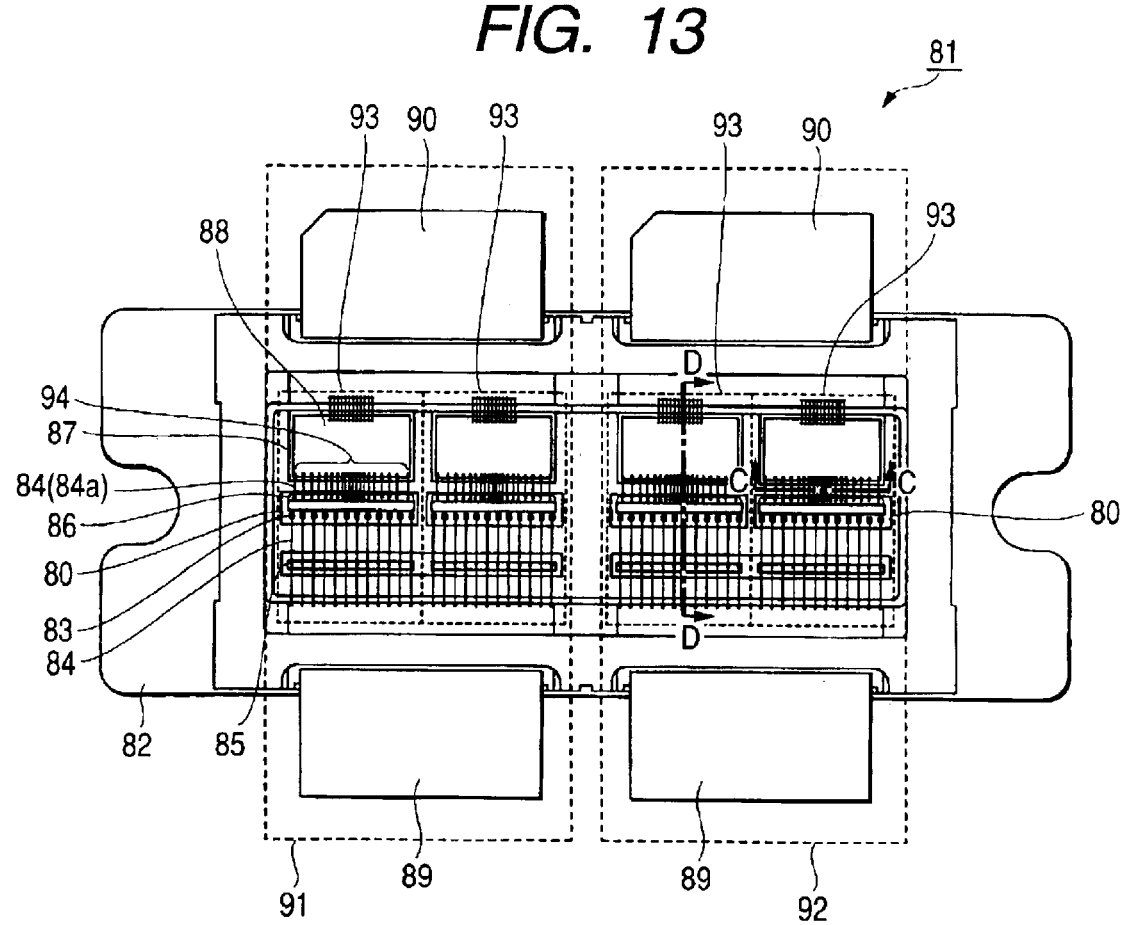
FIG. 13 is a diagram for explaining an internally matching circuit type package, which is another preferred embodiment of the invention.

FIG. 13 is a diagram for explaining the internally matching circuit type package, which is another preferred embodiment of the invention.

The internally matching circuit type package (semiconductor device) 81 shown in FIG. 13 is provided with a package system 82 and the semiconductor chip (Si power MISFET chip) 80 arranged over the package system 82. The dimensions of the semiconductor chip 80 are, for instance, 5 mm on the longer side and 1.5 mm on the shorter side. In the semiconductor chip 80 is formed a MISFET of, for instance, 80 V in withstand voltage, $V_{th}$=2.5 V and 13.0 cm in gate width as the amplifying element. The gate electrode pads 83 of the semiconductor chip 80 are electrically connected to MOS capacitors (MOSCs) 85 via bonding wires 84. The drain electrode pad 86 of the semiconductor chip 80 is electrically connected to a transmission line 88 on a transmission line substrate 87 via the bonding wires 84. The bonding wires 84 are aluminum wires of 50 μm in diameter for instance, and the MOSCs 85 are 150 pF for instance. The transmission line substrate 87 is made of low-loss ceramic of 38 in dielectric constant and measuring, for instance, 4.8 mm in the longer dimension and 3.6 mm in the shorter dimension. The transmission line 88 is, for instance, 4.7 mm wide and 3.5 mm long. The internally matching circuit type package 81 has two each of input package leads 89 and output package leads 90, consists of a first signal transmission line 91 and a second signal transmission line 92, and can be applied to a push-pull circuit to provide an output of 250 W for instance. Further, the first signal transmission line 91 and the second signal transmission line 92 have two unit signal transmission lines 93 each, and are connected to the input package leads 89 signal transmission line by the output package leads 90.

Figure 14:
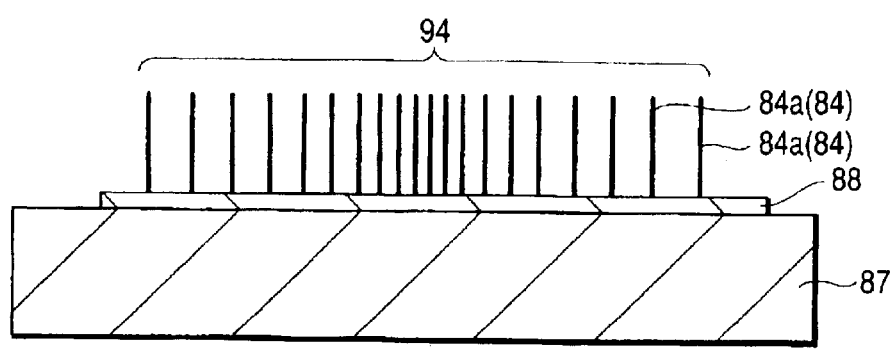
FIG. 14 shows a conceptual section of internally matching circuit type package along the C—C line in FIG. 13.
Figure 15:
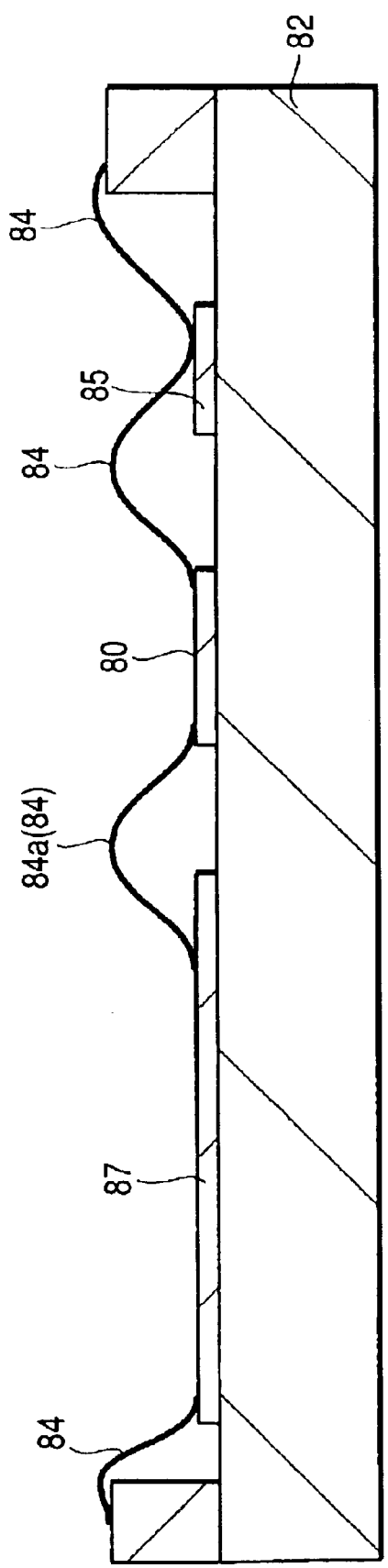
FIG. 15 shows a conceptual section of internally matching circuit type package along the D—D line in FIG. 13.

FIG. 14 shows a conceptual section of the internally matching circuit type package 81 along the C—C line in FIG. 13, and FIG. 15 shows a conceptual section along the D—D line. FIG. 14 shows a sectional view of the output package leads 90 side.

In FIG. 14 are shown, out of the bonding wires 84, bonding wires (output side bonding wires) 84a used for connecting the drain electrode pad 86 of the semiconductor chip 80 and the transmission line 88. As shown in FIG. 14, in this mode of implementation as well, the bonding wires 84a are arranged more sparsely in the end areas and more densely in the central area of a bonding wire array 94 consisting of the bonding wires 84a as is the case with the bonding wires 36 and 37 in Embodiment 1 described above. Thus, the intervals of the bonding wires 84a become gradually shorter from the both end parts towards the central part of the bonding wire array 94.

Further as shown in FIG. 15, the semiconductor chip 80, the transmission line substrate 87 and the MOSCs 85 are electrically connected by the bonding wires 84, and the bonding wires 84 are adjusted in number, connecting positions and loop height.

Next will be described the operation of the internally matching circuit type for base station use in this mode of implementation. The following description will refer to one of the unit signal transmission lines 93 constituting the first signal transmission line 91 and the second signal transmission line 92, because the first signal transmission line 91 and the second signal transmission line 92 are similarly configured.

In this mode of implementation, for instance, the frequency of signals is 2 GHz and the biasing conditions of the semiconductor chip 80 are 28 V in drain voltage and 2.9 V in gate voltage.

High frequency signals inputted to the input package leads 89 are entered by the bonding wires 84 into the semiconductor chip 80 via the MOSC chip 85. The entered signals are amplified by a MISFET formed in the semiconductor chip 80, transmitted by the bonding wires 84 (84a) to the output package leads 90 via the transmission line 88, and outputted. The bonding wires 84 not only electrically connect various members, but also perform the function to match circuit elements. Bonding wires used for connection with FETs, which are on the low impedance side, are sensitive to high frequency characteristics (power, efficiency, gain, distortion and so on).

In this embodiment of the invention, the intervals of the output side bonding wires 84a used between the semiconductor chip 80 and the transmission line 88, which have greater impacts on high frequency characteristics, are adjusted in the same way as in Embodiment 1 described above.

Usually, the inductances of bonding wires are designed to permit widening of the range of frequency characteristics of the circuit with a view to improving frequency characteristics including power, efficiency, gain and distortion within the frequency band.

Since the output impedance of the semiconductor chip 80 is kept extremely low along with the increase in output, it is desirable for the inductances of bonding wires to be low. At the same time, since a large current flows to the drain, a voltage drop due to resistance components of the bonding wires should be prevented.

For this reason, it is desirable for the inductances of the output side bonding wires 84a used for connection between the semiconductor chip 80 and the transmission line 88 to be low, and in this mode of implementation, the number of the output side bonding wires 84a is set to be 20, for instance.

In this embodiment of the invention, on the basis of the same idea as what underlies Embodiment 1 described above, the output side bonding wires 84a used for connection between the drain electrode pad 86 of the semiconductor chip 80 and the transmission line 88 are configured sparsely (at long intervals) in the end areas and densely (at short intervals) in the central area of the bonding wire array 94. Further in this mode of implementation, the drain electrode pad 86, which serves as the output electrode, is configured as an integrated rectangular pad or a rectangular pattern. As a result, the drain electrode pad 86 consisting of one rectangular pattern and the transmission line 88 are connected to each other in parallel by a plurality of bonding wires 84a. By adjusting the connecting positions of the output side bonding wires 84a on the drain electrode pad 86 when applying wire bonding, the intervals of the output side bonding wires 84a can be designed as desired. By setting in the wire bonding process the density of connection of the output side bonding wires 84a to the drain electrode pad 86 consisting of one rectangular pattern sparsely (connected at long intervals) in the end areas of the drain electrode pad 86 and densely (connected at short intervals) in the central area, the aforementioned arrangement of the output side bonding wires 84a, dense in the central area and sparse in the end areas of the bonding wire array 94, can be easily accomplished.

Figure 16:
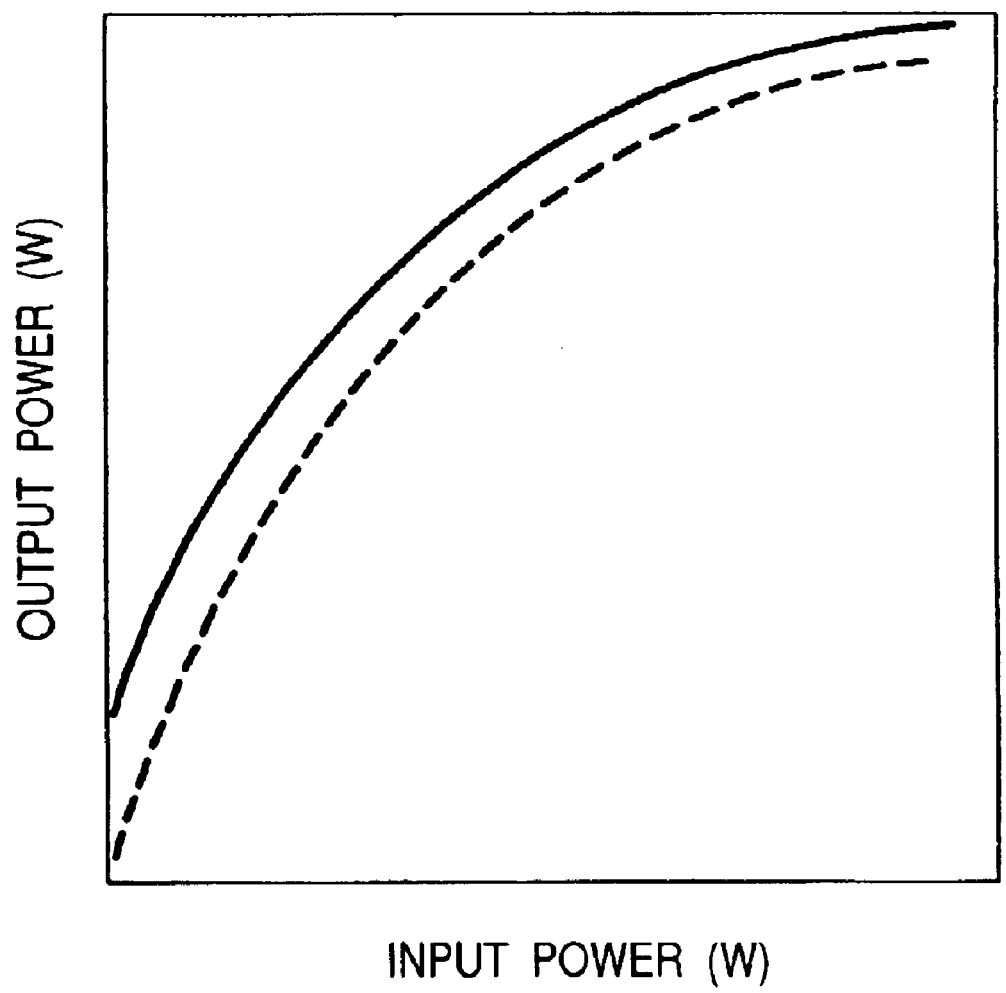
FIG. 16 is a graph showing the output characteristics of the internally matching circuit type package of FIG. 13.

FIG. 16 is a graph showing the output characteristics of the internally matching circuit type package 81. The horizontal axis in the graph of FIG. 16 represents the input power, and the vertical axis represents the output power. In the graph of FIG. 16, the output characteristic of the internally matching circuit type package 81 in this mode of implementation is expressed in a solid curve, and that of a comparative example in which the output side bonding wires 84a used for connecting the drain electrode pad 86 and the transmission line 88 are arranged at equal intervals, in a dotted curve.

As is seen from the graph of FIG. 16, by arranging the output side bonding wires used for connecting the drain electrode pad 86 of 84a the semiconductor chip 80 and the transmission line 88 sparsely in the end areas and densely in the central area as in this mode of implementation, the output characteristics are improved (higher output power is obtained from the same input power). This enables a high performance internally matching circuit type package can be realized. It is particularly effective for a power amplifier for use in mobile telephone base stations.

In this embodiment of the invention, in order to reduce deteriorations in high frequency characteristics due to the unevenness of the inductances of bonding wires, the arrangement of the output side bonding wires 84a used for connection of the drain electrode pad 86 of the semiconductor chip 80 and the transmission line 88 is adjusted. However, it is also acceptable to arrange the bonding wires on the input side (gate side) for connecting the gate electrode pad 83 of the semiconductor chip 80 and the MOSC 85 sparsely in the end areas and densely in the central area of the bonding wire array as those on the output side (drain side).

In this mode of implementation, the high frequency characteristics (including output, efficiency, gain and distortion) of the whole Si power MISFET can be enhanced or improved by using a semiconductor chip (MISFET chip) permitting the adjustment of bonding wire arrangement.

Further in this mode of implementation, by adjusting the arrangement of the gate electrode pad or the drain electrode pad of the semiconductor chip or the positions of connecting the bonding wires to them, the relative density of the bonding wire arrangement is utilized to eliminate the unevenness of inductances. As a result, no long bonding wires are needed between the gate electrode pad or the drain electrode pad and the transmission lines. For this reason, this feature is advantageous in configuring an internally matching circuit in the limited mounting space within the package.

Although the invention by the present inventors has been described in specific terms with reference to the preferred embodiments thereof, it goes without saying that the invention is not limited to these embodiments, but can be modified in various ways without deviating from its essentials.

While the semiconductor device (semiconductor chip) and the external circuit are connected by bonding wires in the modes of implementation described above, the invention is not limited to these modes, but can as well be applied to cases in which strip lines are used for connection wiring. In such cases, the wiring (strip lines) is provided to be dense in the central area and sparse in the end areas.

Further, while the description of the foregoing modes of implementation referred to semiconductor devices provided with amplifying circuits having MISFETs (Si-MISFETs) or HBTs (GaAs-HBTs), the invention is not limited to these modes, but can as well be applied to semiconductor devices having some other types of FETs or bipolar transistors such as metal semiconductor field effect transistors (MESFETs), high electron mobility transistors (HEMTs) or GaAs-field effect transistors (GaAs-FETs). The invention can also be applied to RF modules.

The advantages provided by typical ones out of the aspects of the invention disclosed in the present application will be briefly described below.

By adjusting the arrangement of electrodes for wire connection, the whole semiconductor amplifying element is enabled to operate uniformly. It is also made possible to provide a high gain, high efficiency or low distortion semiconductor amplifying device.

By adjusting the structure of source electrodes or ground electrodes, the whole semiconductor amplifying element is enabled to operate uniformly. It is also made possible to provide a high gain, high efficiency or low distortion semiconductor amplifying device.

What is claimed is:

1. A semiconductor device in which a semiconductor amplifying element is formed, and electrodes for inputting and electrodes for outputting that are electrically connected to said semiconductor amplifying element are provided on its surface, wherein intervals of electrodes are shorter in a central area than in end areas, of an electrode array comprising input electrodes or an electrode array comprising output electrodes, wherein the intervals of said electrodes become gradually shorter from the end areas towards the central area of said electrode array, and wherein said electrodes are formed on two side edges of said semiconductor amplifying element.

2. The semiconductor device according to claim 1, wherein bonding wires are connected to said electrodes.

3. The semiconductor device according to claim 1, wherein said semiconductor amplifying element includes a field effect transistor or a bipolar transistor.

4. The semiconductor device according to claim 1, which is a semiconductor amplifying device for use at a high frequency of approximately 400 MHz or above.

5. The semiconductor device according to claim 1, wherein the electrodes are symmetric with respect to the central area.

6. A semiconductor device comprising:

a semiconductor chip in which a semiconductor amplifying element is formed, electrodes for inputting and electrodes for outputting electrically that are connected to said semiconductor amplifying element are provided on its surface; and a plurality of wiring lines for connecting in parallel said input electrodes and an input terminal outside said semiconductor chip or said output electrodes an output terminal outside said semiconductor chip, wherein wiring intervals are shorter in a central area than in end areas, of a wiring array comprising said plurality of wiring lines, and wherein said wiring intervals become gradually shorter from the end areas towards the central area of said wiring array, and wherein said wiring lines are formed on two side edges of said semiconductor amplifying element.

7. The semiconductor device according to claim 6, wherein said wiring lines are bonding wires.

8. The semiconductor device according to claim 6, wherein said semiconductor amplifying element includes a field effect transistor or a bipolar transistor.

9. The semiconductor device according to claim 6, which is a semiconductor amplifying device for use at a high frequency of approximately 400 MHz or above.

10. The semiconductor device according to claim 6, wherein the wiring lines are symmetric with respect to the central area.

\* \* \* \* \*